(12) United States Patent
Horng

(10) Patent No.: US 6,872,881 B2
(45) Date of Patent: *Mar. 29, 2005

(54) EMI PROTECTIVE ELASTIC PLATE

(76) Inventor: Chin-Fu Horng, 4F, No. 282, Chung Shan I Rd., Lu Chou City, Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/627,708

(22) Filed: Jul. 28, 2003

(65) Prior Publication Data

US 2005/0023018 A1 Feb. 3, 2005

(51) Int. Cl.⁷ ................................................ H05K 9/00
(52) U.S. Cl. ................. 174/35 GC; 174/35 R; 361/818; 277/920
(58) Field of Search .................. 174/35 R, 35 GC, 174/35 C; 361/799, 800, 816, 818, 752; 277/920

(56) References Cited

U.S. PATENT DOCUMENTS

| | | | | |
|---|---|---|---|---|
| 6,305,067 B1 | * | 10/2001 | Horng | 29/458 |
| 6,359,215 B1 | * | 3/2002 | Horng | 174/35 GC |
| 6,489,555 B1 | * | 12/2002 | Horng | 174/35 GC |
| 6,538,197 B1 | * | 3/2003 | Kawai | 174/35 GC |
| 6,627,813 B2 | * | 9/2003 | Chen | 174/35 GC |

\* cited by examiner

*Primary Examiner*—Dean A. Reichard
(74) *Attorney, Agent, or Firm*—Rosenberg, Klein & Lee

(57) ABSTRACT

An electromagnetic interference (EMI) protective elastic plate has a contact wall having a pair of upper sidewalls extending downwardly and perpendicularly from two sides thereof A connect wall extends downwardly and forwardly from an end of the contact wall and is formed with an upper bending portion therebetween. The other end of the connect wall forms a lower bending portion with a backward concave. A solder wall connects with the lower bending portion and has a pair of lower sidewalls extending upwardly and perpendicularly from two sides thereof. The upper sidewalls and the lower sidewalls are slidably buckled to each other.

10 Claims, 7 Drawing Sheets

EMI PROTECTIVE ELASTIC PLATE

BACKGROUND OF THE INVENTION

1. Field of the Invention

The present invention relates to an electromagnetic interference (EMI) protective elastic plate, more particularly, to an elastic plate to shield a microprocessor and memory on a motherboard of a computer from electromagnetic interference.

2. Description of Related Art

Electromagnetic interference is a serious problem in the electronics industry. As integrated circuits become more broadly applied, EMI protective design is of growing interest in the field of electronics.

Current EMI protection devices are mostly adaptations of metal elastic plates. As described in U.S. Pat. No. 6,305,067B1, the metal elastic plate is generally S-shaped and mounted between a printed circuit board and a shield shell for discharging electromagnetic charges of an electronic product through the shield shell. However, the two sides of the elastic plate are open-ended and mounted around electrical elements, and the elastic plate is thus easily hooked on external objects and deformed.

FIG. 1 illustrates a conventional structural improvement. The elastic plate 100a, which is soldered on a PCB 80 via soldering tins 70, has a pair of side walls 12a respectively and downwardly extending from a contact wall 1a for preventing hooking and pulling of external things. However, the elastic plate still has some open-ended area, and even the side walls increase hooking and pulling opportunities.

SUMMARY OF THE INVENTION

It is one object of the present invention is to provide an EMI protective elastic plate having a pair of side walls buckled to each other so as to reduce hooking by external objects, and that, even when hooked, still has a predetermined resistance for resisting the hooking force.

In order to achieve the above object, the present invention according to one aspect thereof provides an electromagnetic interference (EMI) protective elastic plate comprising a contact wall having a pair of upper sidewalls extending downwardly and perpendicularly from two sides thereof; a connect wall extending downwardly and forwardly from an end of the contact wall and formed with an upper bending portion therebetween, the other end of the connect wall forming a lower bending portion with a backward concave; and a solder wall connecting with the lower bending portion and having a pair of lower sidewalls extending upwardly and perpendicularly from two sides thereof. The upper sidewalls and the lower sidewalls are slidably buckled to each other.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
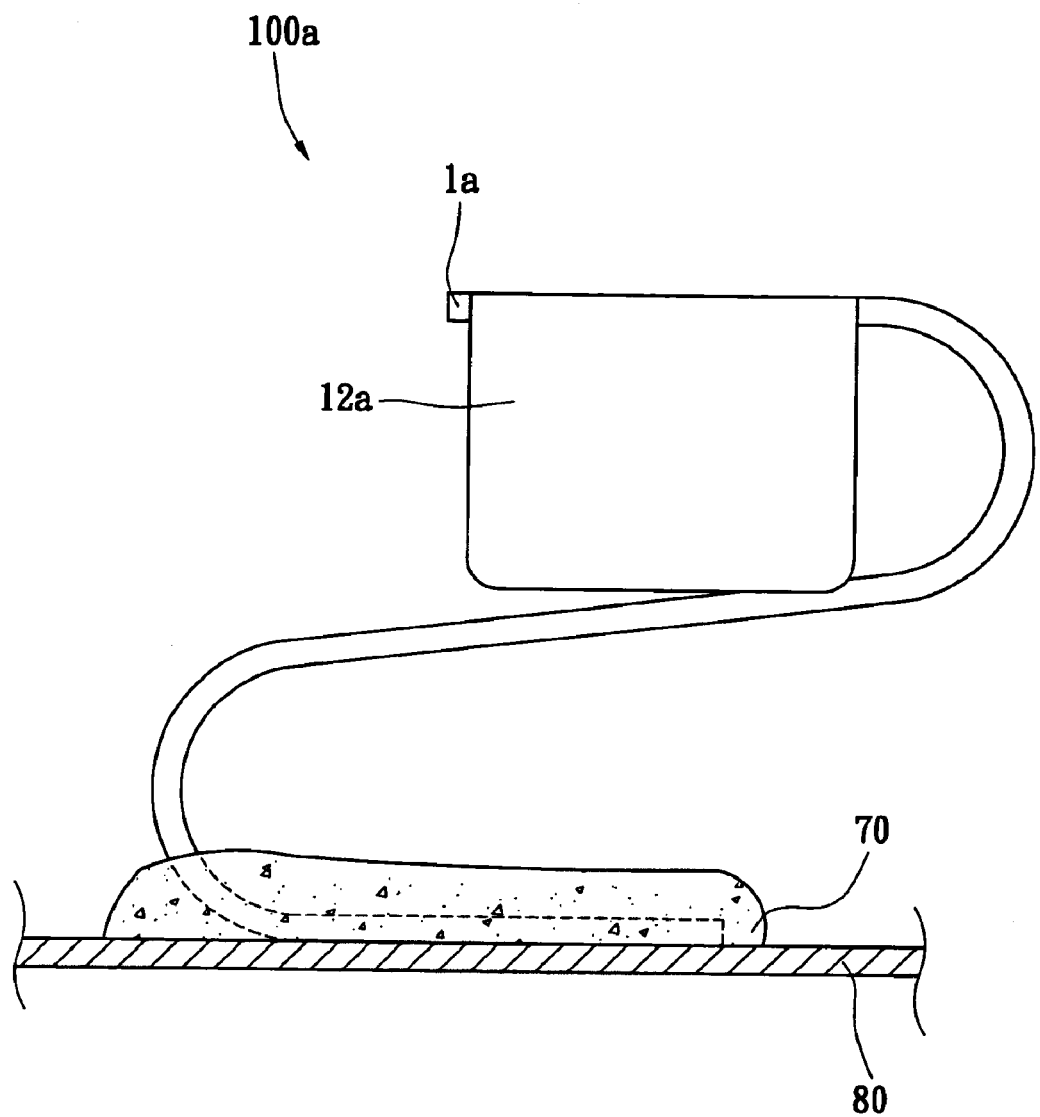
FIG. 1 is a perspective view of an elastic plate of prior art.
Figure 2:
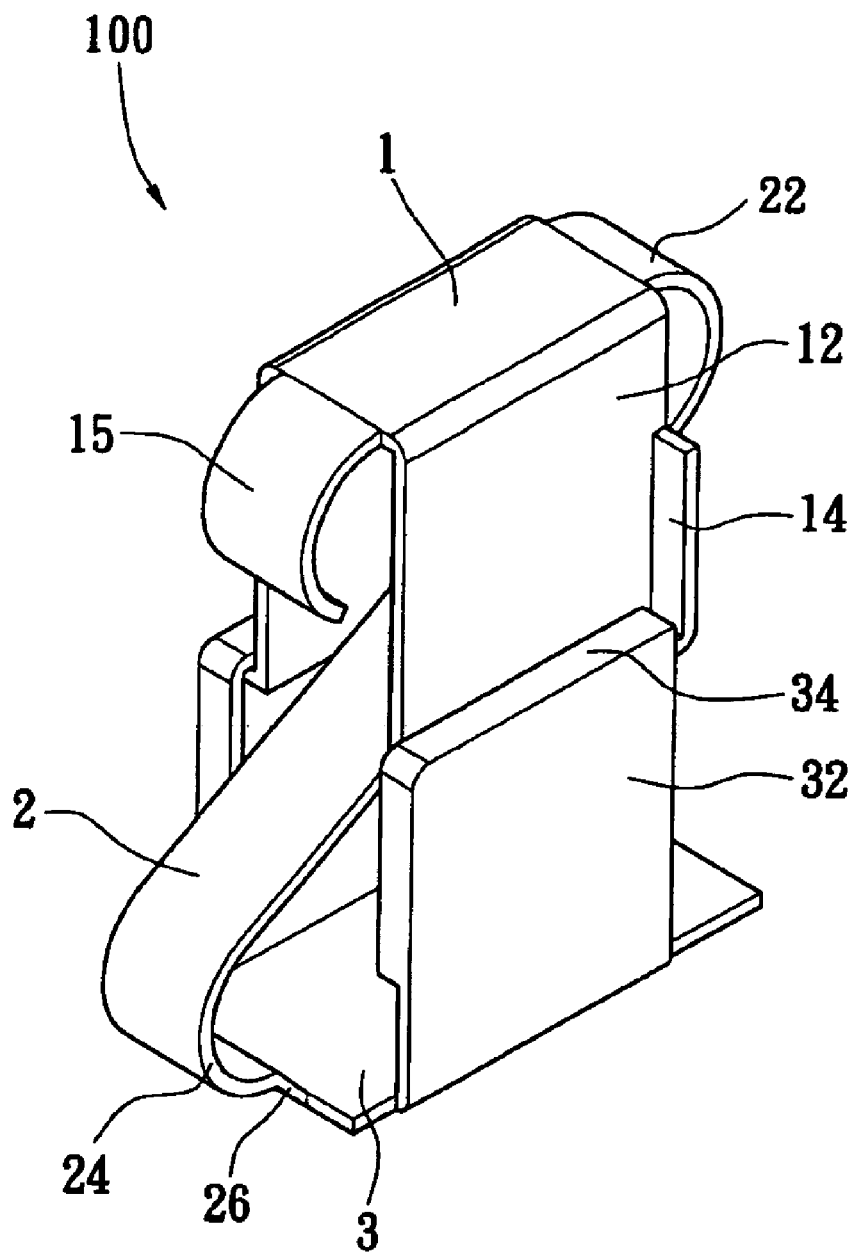
FIG. 2 is a perspective view of an EMI protective elastic plate of the present invention.
Figure 3:
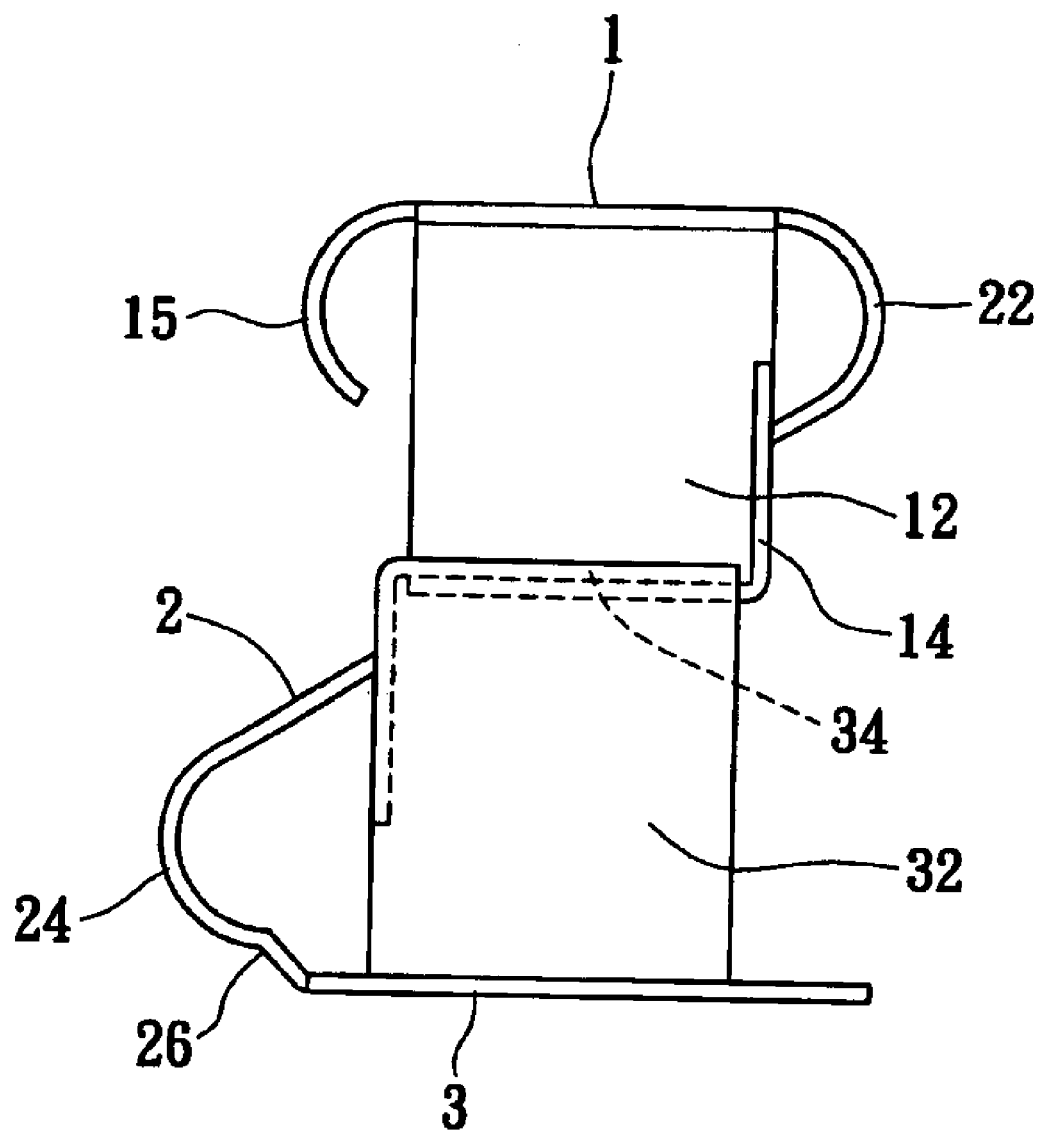
FIG. 3 is a side view of the EMI protective elastic plate of the present invention.

FIGS. 2 and 3 are respectively a perspective view and a side view of an electromagnetic interference (EMI) protective elastic plate according to the present invention. The elastic plate 100 comprises a contact wall 1, a connect wall 2, and a solder wall 3. The contact wall 1 has a pair of upper sidewalls 12 extending downwardly and perpendicularly from two sides thereof. The connect wall 2 extends downwardly and forwardly from an end of the contact wall 1. An upper bending portion 22 is formed between the connect wall 2 and the contact wall 1. The other end of the connect wall 2 forms a lower bending portion 24 with a backward concave. The solder wall 3 connects with the lower bending portion 24 and has a pair of lower sidewalls 32 extending upwardly and perpendicularly from two sides thereof. Each upper sidewall 12 has an upper protruding plate 14, which is generally L-shaped and protrudes from a side and bottom edges of the upper sidewalls 12. Each lower sidewall 32 has a lower protruding plate 34 mating with the protruding plate 14 of the upper sidewalls 12 and protruding from a side and bottom edges of the lower sidewalls 32. The upper and lower protruding plates 14, 34 are slidably engaged with each other, and limit the sliding direction therebetween. Therefore, the upper and lower sidewalls 12 and 32 not only reduce the opportunity of external objects falling or hooking, but also have a predetermined structural ability for resisting hooking forces from objects, so as to reduce the possibility of excessive deformation.

The contact wall 1 further has a curved preventing plate 15 formed on a forward end thereof, which also reduces the possibility of external objects falling and hooking. The lower bending portion 24 of the connect wall 2 further has an inwardly concaved strengthening portion 26 adjacent the solder wall 3, thereby strengthening the soldering efficiency of the solder wall 3.

Figure 4:
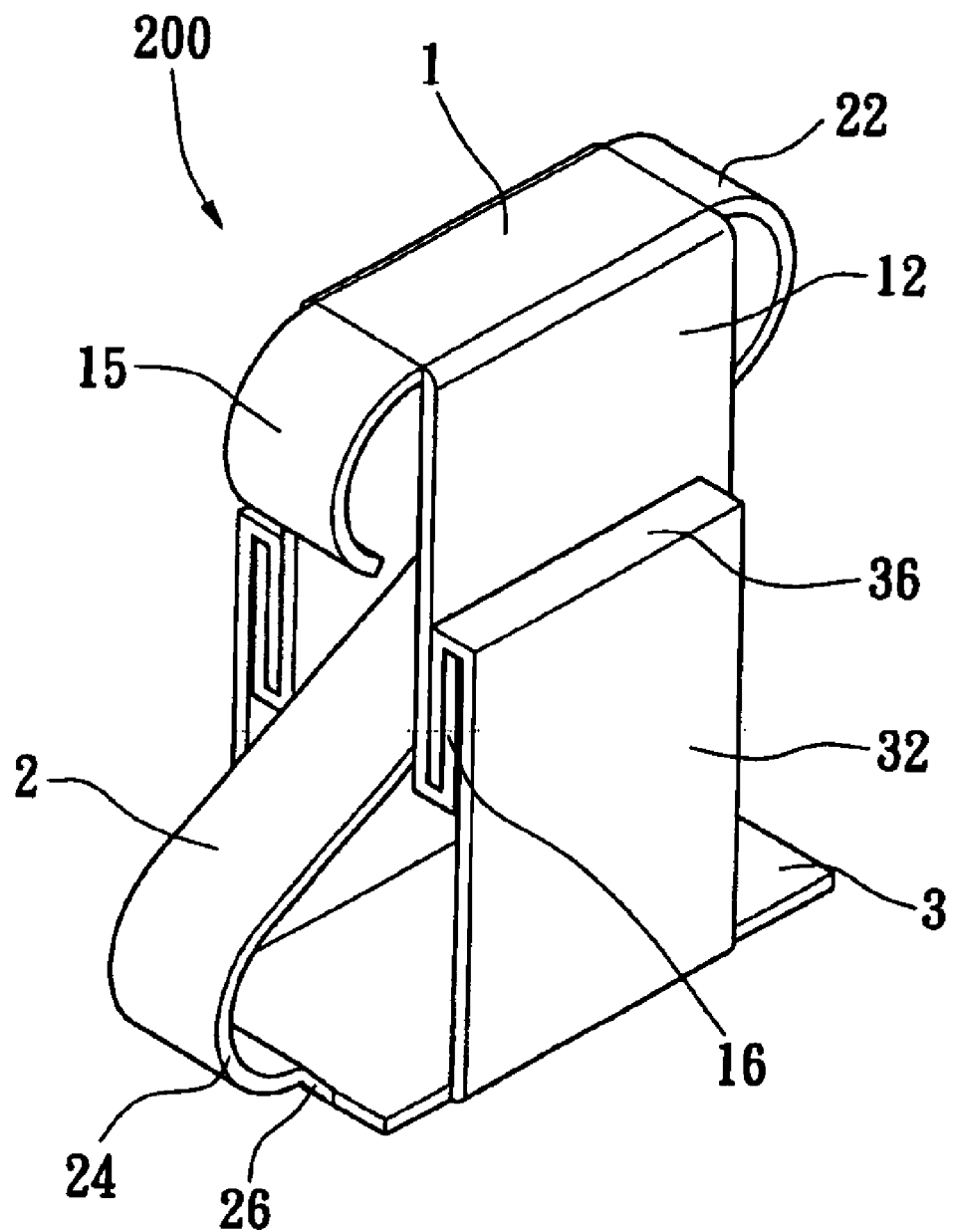
FIG. 4 is a perspective view of the second embodiment of the present invention.

FIG. 4 illustrates a second embodiment of the present invention. The upper sidewalls 12 and the lower sidewalls 32 of an EMI protective elastic plate 200 are respectively formed with a pair of plate-like inverted portions 16, 36 on two distal ends thereof for slidably buckling to each other, so as to resist hooking by external objects.

Figure 5:
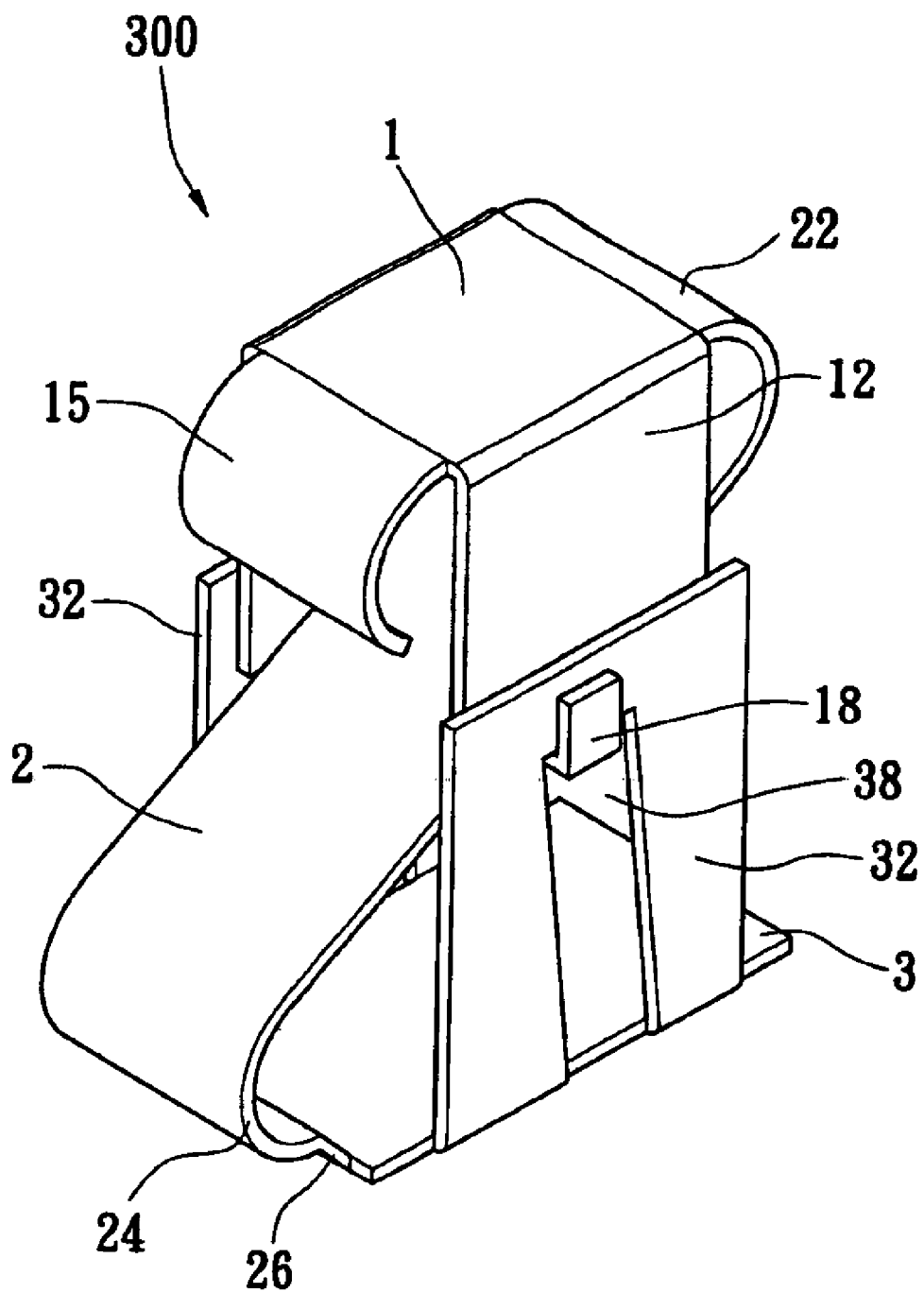
FIG. 5 is a perspective view of the third embodiment of the present invention.

Referring to FIG. 5 is a third embodiment of the present invention. The two upper sidewalls 12 of an EMI protective elastic plate 300 are respectively formed with an upward plate-like inverted portion 18. The two lower sidewalls 32 are respectively formed with a vertical sliding slot 38 for receiving the inverted portions 18 sliding therein. Equivalently, this embodiment also could feature the two lower sidewalls 32 of an EMI protective elastic plate 300 respectively formed with an upward plate-like inverted portion (not shown). The two upper sidewalls 32 would then be respectively formed with a vertical sliding slot (not shown) for receiving the inverted portions sliding therein.

Figure 6:
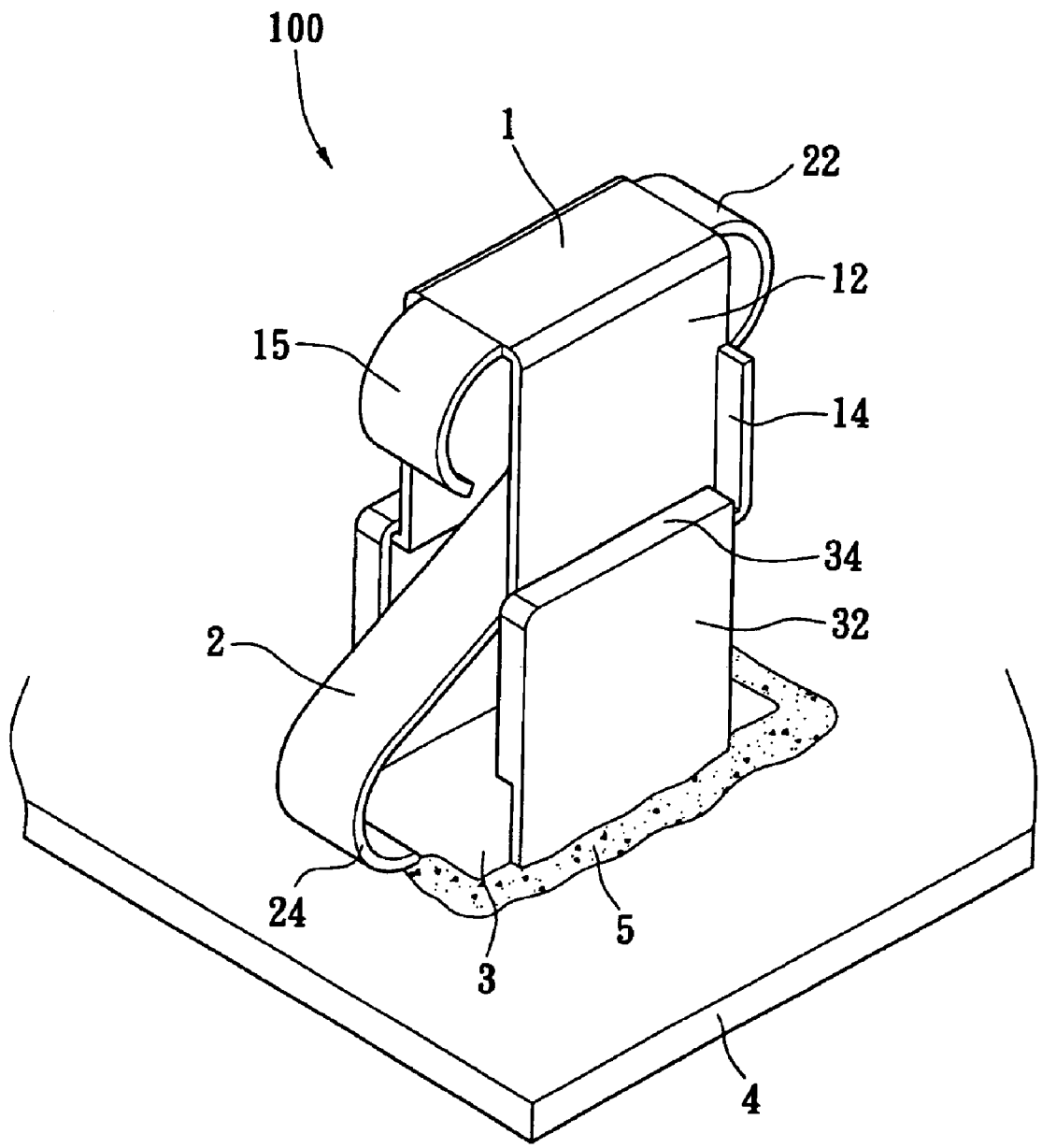
FIG. 6 is a perspective view of the elastic plate of the present invention used to a PCB.

Referring to FIG. 6, is a perspective view of the present invention applied on a printed circuit board. The EMI protective elastic plate of the present invention is soldered on a PCB 4 with the solder wall 3 through solder tins 5.

Figure 7:
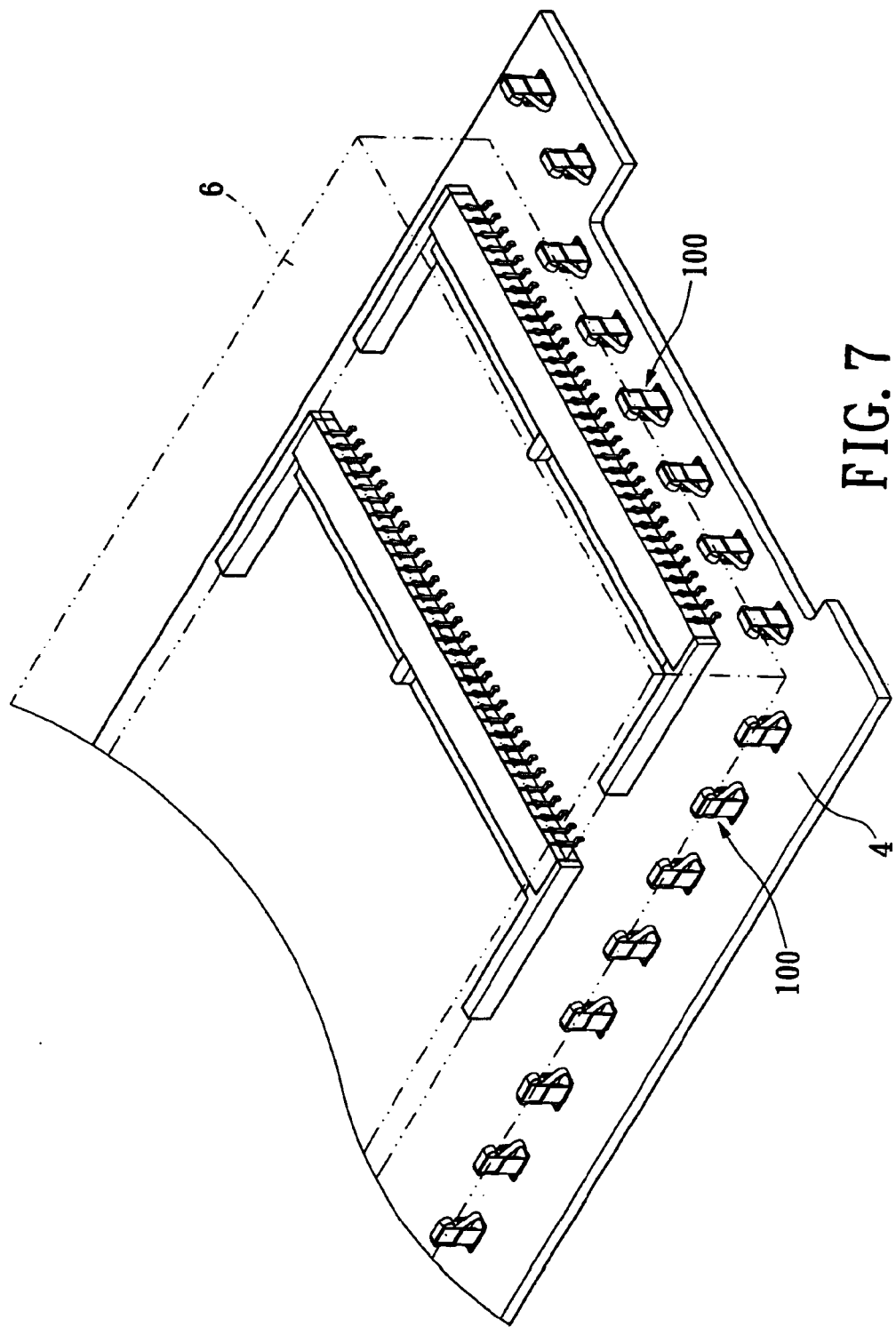
FIG. 7 is a perspective view of the present invention applied in a computer mainframe board.

Referring to FIG. 7, the elastic plate 100 of the present invention is used for a computer mainframe board 4. A plurality of elastic plates 100 are arranged on the microprocessor of the computer mainframe board 4 and the periphery of a memory. The arranged distances of the elastic plates 100 are determined according to the function of the microprocessor. The distance of two elastic plates 100 is based on the standard of EMI. A cover 6 is connected to the contact wall 1 of each elastic plate 100 for shielding the electromagnetic wave radiated from the processor and memory.

When the elastic plate 100 is assembled on a computer mainframe board 4, it reduces the opportunity for hooking and falling thereinto of outer objects. Additionally, the sidewalls of the elastic plate can resist a predetermined hooking.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An electromagnetic interference (EMI) protective elastic plate comprising:
   a contact wall having a pair of upper sidewalls extending downwardly and perpendicularly from two sides thereof;
   a connect wall extending downwardly and forwardly from an end of said contact wall and formed with an upper bending portion therebetween, another end of said connect wall forming a lower bending portion with a backward concave; and
   a solder wall connecting with said lower bending portion and having a pair of lower sidewalls extending upwardly and perpendicularly from two sides thereof; wherein
      said upper sidewalls and said lower sidewalls are slidably buckled to each other.

2. The electromagnetic interference (EMI) protective elastic plate as in claim 1, wherein said upper sidewalls are respectively formed with an upward plate-like hook on a distal end thereof and said lower sidewalls are respectively formed with a vertical sliding slot thereon for said hooks of said upper sidewalls to buckle slidably therein.

3. The electromagnetic interference (EMI) protective elastic plate as in claim 1, wherein said lower sidewalls are respectively formed with a downward plate-like hook on a distal end thereof and said upper sidewalls are respectively formed with a vertical sliding slot thereon for said hooks of said lower sidewalls to buckle slidably therein.

4. The electromagnetic interference (EMI) protective elastic plate as in claim 1, wherein said upper sidewalls and said lower sidewalls are respectively formed with a pair of plate-like inverted portions on two distal ends thereof for slidably buckling with each other.

5. The electromagnetic interference (EMI) protective elastic plate as in claim 1, wherein said contact wall further has a bending-like preventing plate formed on a forward end thereof.

6. The electromagnetic interference (EMI) protective elastic plate as in claim 1, wherein said lower bending portion further has an inwardly concaved strengthening portion adjacent to said solder wall, said solder wall thereby having a strengthened soldering efficiency.

7. An electromagnetic interference (EMI) protective elastic plate comprising:
   a contact wall having a pair of upper sidewalls extending downwardly and perpendicularly from two sides thereof;
   a connect wall extending downwardly and forwardly from an end of said contact wall and formed with an upper bending portion therebetween, another end of said connect wall forming a lower bending portion with a backward concave; and
   a solder wall connecting with said lower bending portion and having a pair of lower sidewalls extending upwardly and perpendicularly from two sides thereof; wherein
      a protruding plate protrudes respectively from said upper sidewalls and said lower sidewalls, and the protruding plates are slidably engaged to each other.

8. The electromagnetic interference (EMI) protective elastic plate as in claim 7, wherein said protruding plates respectively protrude horizontally from a bottom of said upper and lower sidewalls.

9. The electromagnetic interference (EMI) protective elastic plate as in claim 7, wherein each protruding plate is generally L-shaped and protrudes from a side and bottom edges of said upper and lower sidewalls, thereby limiting a sliding direction of said protruding plates.

10. The electromagnetic interference (EMI) protective elastic plate as in claim 7, wherein said contact wall further has a bending-like preventing plate formed on a forward end thereof, and wherein said lower bending portion further has an inwardly-concaved strengthening portion adjacent to said solder wall.

* * * * *